(12) United States Patent
Kawasaki et al.

(10) Patent No.: US 8,286,041 B2
(45) Date of Patent: Oct. 9, 2012

(54) SEMICONDUCTOR INTEGRATED CIRCUIT AND METHOD OF SAVING AND RESTORING INTERNAL STATE OF THE SAME

(75) Inventors: Tatsuya Kawasaki, Kanagawa (JP); Tsuneki Sasaki, Kanagawa (JP); Shuichi Kunie, Kanagawa (JP)

(73) Assignee: Renesas Electronics Corporation, Kawasaki-shi, Kangawa (JP)

( * ) Notice: Subject to any disclaimer, the term of this patent is extended or adjusted under 35 U.S.C. 154(b) by 417 days.

(21) Appl. No.: 12/654,267

(22) Filed: Dec. 15, 2009

(65) Prior Publication Data

US 2010/0174956 A1 Jul. 8, 2010

(30) Foreign Application Priority Data

Dec. 16, 2008 (JP) ................................ 2008-320082

(51) Int. Cl.
*G01R 31/28* (2006.01)
(52) U.S. Cl. ............ 714/726; 714/15; 714/729; 714/30; 714/727; 712/228; 713/322; 713/330; 365/154
(58) Field of Classification Search .................. None
See application file for complete search history.

(56) References Cited

U.S. PATENT DOCUMENTS

| | | | | |
|---|---|---|---|---|
| 2002/0162037 A1* | 10/2002 | Woods et al. | ................. | 713/322 |
| 2004/0153762 A1* | 8/2004 | Flynn et al. | ..................... | 714/15 |
| 2005/0010832 A1* | 1/2005 | Caswell et al. | ............... | 713/330 |
| 2007/0101108 A1* | 5/2007 | Grossman et al. | ............ | 712/228 |
| 2007/0150780 A1* | 6/2007 | Shimooka | ..................... | 714/726 |
| 2007/0265823 A1* | 11/2007 | Cha et al. | ......................... | 703/24 |
| 2011/0216578 A1* | 9/2011 | Penzes | .......................... | 365/154 |

FOREIGN PATENT DOCUMENTS

| | | |
|---|---|---|
| JP | 2007-157027 | 6/2007 |
| JP | 2008-251013 | 10/2008 |

OTHER PUBLICATIONS

European Search Report dated Mar. 17, 2010.

* cited by examiner

*Primary Examiner* — John Trimmings
(74) *Attorney, Agent, or Firm* — McGinn IP Law Group, PLLC

(57) ABSTRACT

A semiconductor integrated circuit includes a scan chain which includes: first flip-flops contained in a first circuit and second flip-flops contained in a second circuit, wherein the first flip-flops and the second flip-flops are connected in a series connection in a scan path test mode to operate as a shift register, and a first selecting circuit configured to selectively output a test data in the scan path test mode and internal state data indicating an internal state of the first flip-flops and read from a memory circuit in a restoring operation in a normal mode to the series connection. The semiconductor integrated circuit further includes a backup control circuit configured to control the scan chain in a saving operation in the normal mode such that the internal state data is stored in the memory circuit without passing through the second flip-flops, in the restoring operation in the normal mode such that the internal state data from the first selecting circuit is set in the first flip-flops without passing through the second flip-flops, and in the scan path test mode such that the test data is shifted in the series connection.

14 Claims, 10 Drawing Sheets

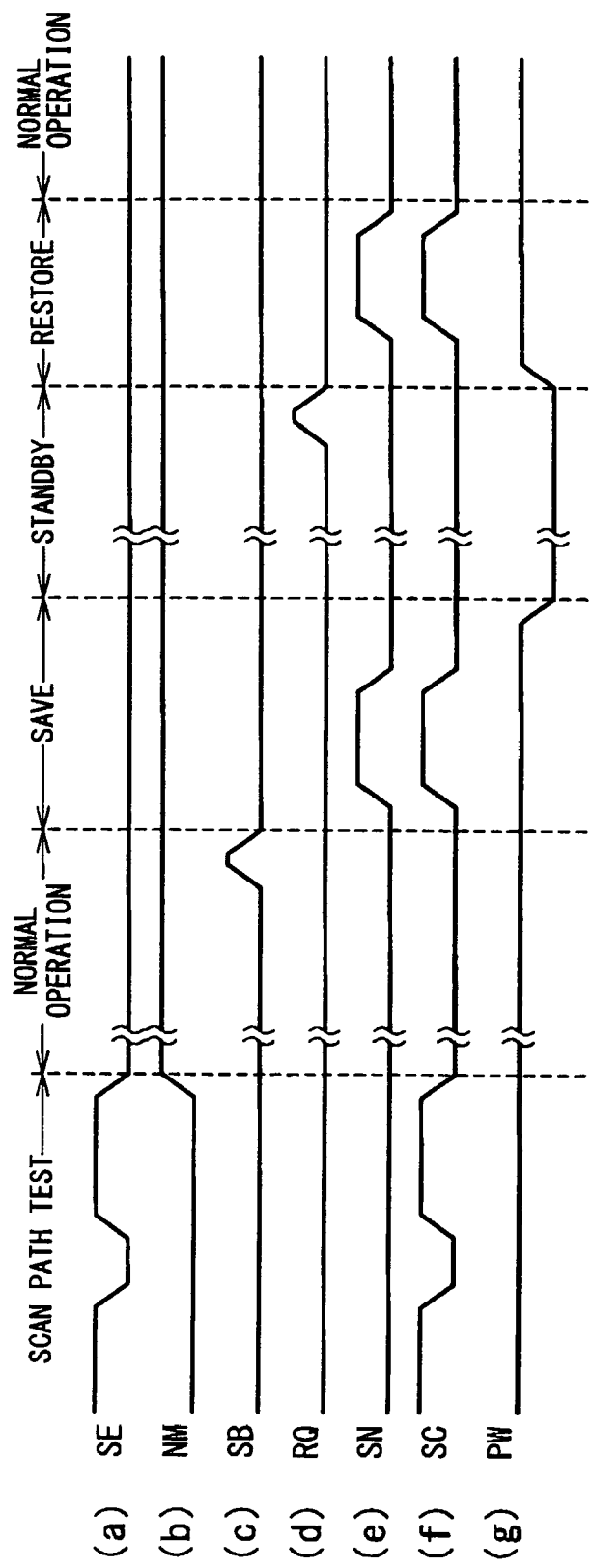

SEMICONDUCTOR INTEGRATED CIRCUIT AND METHOD OF SAVING AND RESTORING INTERNAL STATE OF THE SAME

INCORPORATION BY REFERENCE

This patent application claims a priority on convention based on Japanese Patent Application No. 2008-320082. The disclosure thereof is incorporated herein by reference.

BACKGROUND OF THE INVENTION

1. Field of the Invention

The present invention relates to a semiconductor integrated circuit, and particularly, the present invention relates to a technique for saving and restoring an internal state of the semiconductor integrated circuit.

2. Description of Related Art

In recent years, attention is paid on a semiconductor integrated circuit having a standby function and a resume function for a low power consumption mode. Normally, if the power supply to the semiconductor integrated circuit is stopped, an internal state thereof is lost excluding a nonvolatile memory. Therefore, it is necessary to hold the internal state in order to restart the operation of the integrated circuit from the state just before the power supply of the integrated circuit is stopped, when the power supply is restarted.

For example, in Japanese Patent Application Publication (JP 2007-157027A: first conventional example), a technique for saving and restoring the internal state of the semiconductor integrated circuit by using a scan chain to be used for a scan path test is disclosed. This semiconductor integrated circuit includes a target circuit and a backup control circuit. The target circuit is provided with at least a scan chain for forming a shift register in a scan path test mode and serially inputting and outputting a test data. The backup control circuit stores an internal state data indicating the internal state of the target circuit into a memory and reads out it from the memory. The scan chain is divided into a plurality of sub scan chains and these plural sub scan chains are operated in parallel. The internal state data are outputted from the plurality of sub chains and are stored in the memory. The internal state data that are stored in the memory are set in the plurality of sub scan chains again. According to this technique, by dividing the scan chain into the plurality of sub scan chains, saving and restoring times of the internal state are shortened and the power consumption amount of the circuit in a standby state is reduced.

SUMMARY OF THE INVENTION

In an aspect of the present invention, a semiconductor integrated circuit includes a scan chain which includes: first flip-flops contained in a first circuit and second flip-flops contained in a second circuit, wherein the first flip-flops and the second flip-flops are connected in a series connection in a scan path test mode to operate as a shift register, and a first selecting circuit configured to selectively output a test data in the scan path test mode and internal state data indicating an internal state of the first flip-flops and read from a memory circuit in a restoring operation in a normal mode to the series connection. The semiconductor integrated circuit further includes a backup control circuit configured to control the scan chain in a saving operation in the normal mode such that the internal state data is stored in the memory circuit without passing through the second flip-flops, in the restoring operation in the normal mode such that the internal state data from the first selecting circuit is set in the first flip-flops without passing through the second flip-flops, and in the scan path test mode such that the test data is shifted in the series connection.

In another aspect of the present invention, a method of saving and restoring an internal state in a semiconductor integrated circuit, is achieved by providing a scan chain which includes: first flip-flops contained in a first circuit and second flip-flops contained in a second circuit, wherein the first flip-flops and the second flip-flops are connected in a series connection to be operable as a shift register, and a first selecting circuit connected to a front stage of the series connection. The method is attained by further including: selecting in the first selecting circuit, a test data in the scan path test mode and internal state data indicating an internal state of the first flip-flops and outputted from a memory circuit in a restoring operation in a normal mode; passing the test data through the scan chain in the scan path test mode; saving the internal state data in the memory circuit without passing through the second flip-flops, in a saving operation in the normal mode; and restoring the internal state data in the first flip-flops without passing through the second flip-flops in the restoring operation in the normal mode.

The present invention can provide a semiconductor integrated circuit and a method for saving and restoring an internal state of the semiconductor integrated circuit, which are capable of shortening saving and restoring times of the internal state and reducing the power consumption.

BRIEF DESCRIPTION OF THE DRAWINGS

The above and other objects, advantages and features of the present invention will be more apparent from the following description of certain embodiments taken in conjunction with the accompanying drawings, in which:

FIG. 3 shows timing charts in an operation of the semiconductor integrated circuit according to the embodiment of the present invention;

DESCRIPTION OF THE EMBODIMENTS

Hereinafter, a semiconductor integrated circuit will be described in detail with reference to the attached drawings.

Figure 1:
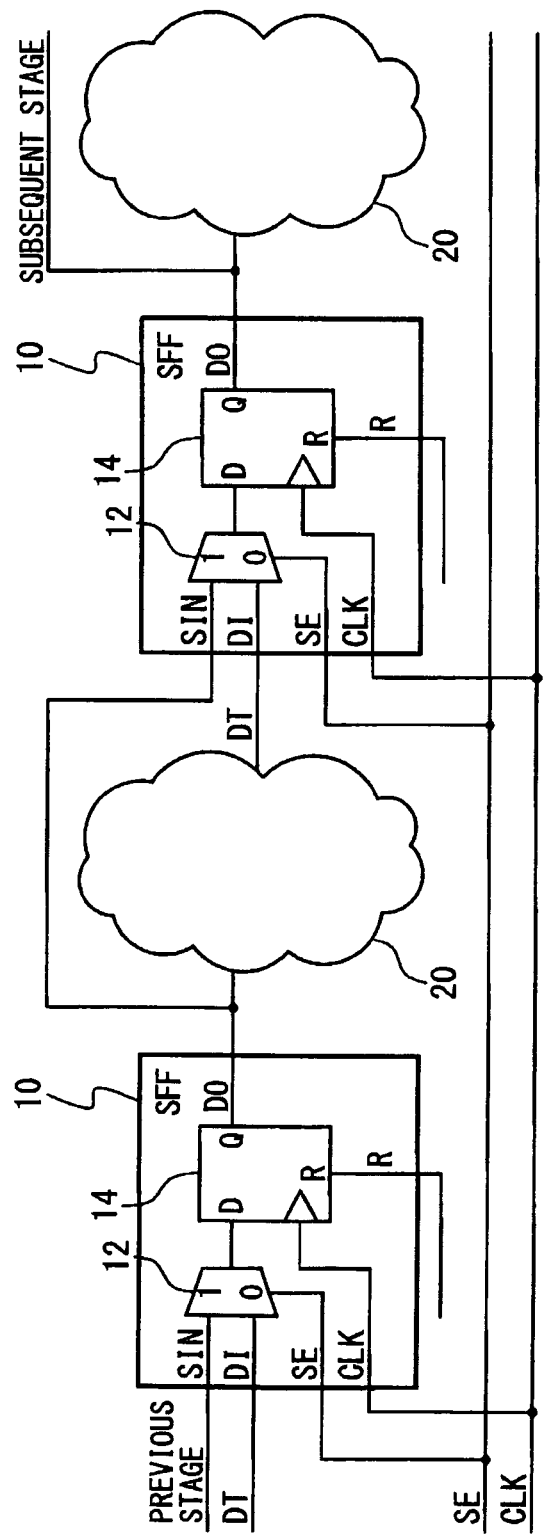
FIG. 1 is a diagram explaining a scan flip-flop and a scan chain.

At first, referring to FIG. 1, scan flip-flops that form a scan chain according to an embodiment of the present invention will be described. FIG. 1 schematically shows a connection state of scan flip-flops 10 in the scan chain. The scan flip-flop 10 is provided with a selecting circuit 12 and a flip-flop main unit 14, as shown in FIG. 1. The selecting circuit 12 selects data to be latched by the flip-flop main unit 14. In other words, the selecting circuit 12 selects one of a data outputted from the scan flip-flop 10 at a previous stage and a data outputted from a normal path 20 that is a combinational circuit, and provides the selected data to the flip-flop main unit 14. The flip-flop main unit 14 receives the data outputted from the selecting circuit 12 in synchronization with a clock signal CLK and outputs it. The selecting circuit 12 selects the data to be outputted on the basis of a scan enable signal SE. When the scan enable signal SE is active ("1"), the selecting circuit 12 selects the data outputted from the scan flip-flop 10 at the previous stage. As a result, the scan flip-flops 10 form the scan chain.

In a normal operation, the scan enable signal SE is inactive ("0"), and the selecting circuit 12 selects the data DT outputted from the normal path 20 and outputs the selected data to the flip-flop main unit 14. The flip-flop main unit 14 receives the data DT in synchronization with the clock signal CLK and holds it. The held data, namely, the internal state is outputted to the normal path 20 as a data DO. Therefore, the scan flip-flop 10 updates the internal state in synchronization with the clock signal.

When the scan enable signal SE becomes active ("1"), the selecting circuit 12 selects the data DO outputted from the scan flip-flop 10 at the previous stage and outputs the selected data to the flip-flop main unit 14. The flip-flop main unit 14 receives the data DO in synchronization with the clock signal CLK and holds it. The held data DO is outputted to the normal path 20 and the scan flip-flop 10 at a next stage. While the scan enable signal SE is active, the scan flip-flop 10 receives not the data DT outputted from the normal path 20 but the data DO outputted from the scan flip-flop 10 at the previous stage. As a result, the scan chain is formed by a sequence of scan flip-flops 10, to operate as a shift register that operates in synchronization with the clock signal CLK.

In the above description, the scan flip-flop 10 has a circuit configuration as shown in FIG. 1. However, the scan flip-flop having another circuit configuration may be available. The scan flip-flop is sufficient if it operates as a part of a shift register in a scan path test mode and individually holds an internal state in a normal operation. Further, it is preferable that the scan flip-flop 10 is provided with a node R that receives a reset signal for setting an initial state.

The scan chain tends to be long in order to decrease the number of input and output ports. Accordingly, in the case of using this scan chains for saving and restoring an internal state, a saving time and a restoring time become longer. In order to shorten the saving and restoring times, the scan chain needs to be shortened. According to the present invention, the saving and restoring times are shortened by removing circuits, that do not contribute to the normal operation, such as a test dedicated circuit included in the scan chain in the saving and restoring operations.

On the other hand, the saving and restoring operations are carried out to reduce a power consumption amount by stopping the supply of power to a target circuit after saving the internal state. As a result, when the supply of power is restarted, the stored internal state is restored in the target circuit, and the operation is restarted. In this case, the circuits that are excluded from the saving and restoring operations hold unspecified values. Therefore, there is a possibility that these circuits may affect on the circuit having its internal state reset by the restoring operation, so that it is necessary to prevent an erroneous operation due to these circuits.

Figure 2:
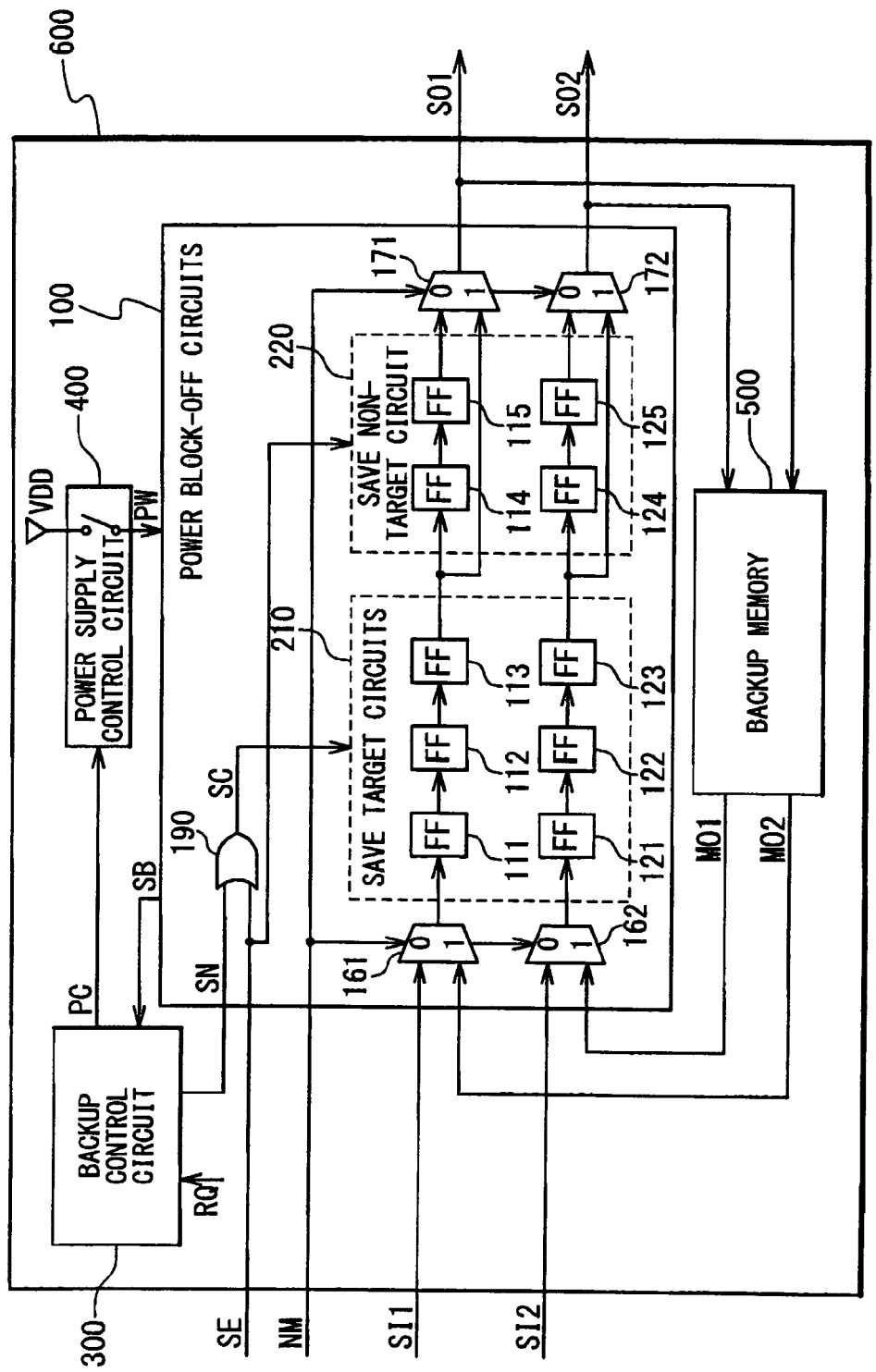
FIG. 2 is a diagram showing a configuration of a semiconductor integrated circuit according to an embodiment of the present invention.

FIG. 2 is a diagram showing a configuration of the semiconductor integrated circuit in which the internal state is saved and restored. A semiconductor integrated circuit 600 is provided with a power block-off circuit 100, e.g. a circuit such as a CPU, which has an operating state and a standby state and may stop the operation in the standby state. If its internal state is held in the standby mode, it is also possible to stop the supply of power. Even if the supply of power is stopped, the content thereof is not saved since the internal state is held in flip-flops. According to the present invention, the internal state held in the flip-flops is stored or saved in a backup memory circuit 500 to which the power is always supplied, when the standby state is set, read from the backup memory circuit 500 upon restart of the operation, and set in the flip-flops again. As a result of this, the power consumption amount in the standby mode is reduced.

The semiconductor integrated circuit 600 is provided with a power block-off circuit 100, and the supply of power to the power block-off circuit 100 can be started and stopped based on the operating state. The supply of power to the power block-off circuit 100 is controlled by a power supply control circuit 400.

As shown in FIG. 2, the semiconductor integrated circuit 600 in the embodiment is provided with circuits located in the power block-off circuit 100, a backup control circuit 300, the power supply control circuit 400, and the backup memory circuit 500. The circuits located in the power block-off circuit 100 are provided with scan flip-flops (hereinafter, to be referred to as flip-flops) 111 to 115, and scan flip-flops 121 to 125, selecting circuits 161, 162, 171 and 172, an OR circuit 190, and further, a combinational circuit (a normal path) 20 that is not illustrated here. In this case, a circuit including a complex logic circuit and many flip-flops such as a central processing unit (CPU) is assumed as the circuits located in the power block-off circuit 100, and this circuit has the normal operating state and the standby state. In the standby state, these circuits are required to reduce the power consumption amount as much as possible. Accordingly, before these circuits are brought into the standby state, the internal state held in flip-flops are saved in the backup memory circuit 500, and the supply of power to the power block-off circuit 100 is stopped.

The backup control circuit 300 controls the saving and restoring operations of the internal state and the supply of power to the power block-off circuit 100. An instruction of the saving operation of the internal state is issued from the circuit located in the power block-off circuit 100 with a standby instructing signal SB. This instruction may be issued from another control circuit; however, the description is given here under the assumption that software that operates in the circuit located in the power block-off circuit 100 instructs the saving operation of the internal state.

The power supply control circuit 400 controls the supply of power to the power block-off circuit 100 in response to an instruction signal PC outputted from the backup control circuit 300.

The backup memory circuit 500 is provided with a memory section, an address counter, and a control circuit (which are not shown). In the saving and restoring operations, the data inputted in sequence is written and stored in the memory section and the stored data is read in sequence in the backup memory circuit 500. The backup memory circuit 500 may be configured anyway if it can write and read the data in sequence. If the memory section is a nonvolatile memory, the supply of power to this memory section can stop in the standby mode. If the memory section is a volatile memory, although it is necessary to continue the supply of power, the data is only held and the writing and reading operations are not carried out in the standby mode. Therefore, the power consumption amount of the backup memory circuit 500 is small. In addition, according to the present embodiment, the backup memory circuit 500 is provided inside of the semiconductor integrated circuit 600; however, the backup memory circuit 500 may be provided outside of the semiconductor integrated circuit 600.

If the backup of the internal state is instructed by the standby signal SB, the backup control circuit 300 saves the internal state that is held by the flip-flops 111 to 113 and 121 to 123 included in a save target circuit 210, into the backup memory circuit 500 via the scan chains. If saving operation of the internal state is ended, the backup control circuit 300 instructs the power supply control circuit 400 to stop the supply of power to the power block-off circuit 100. In addition, if release from the standby state is instructed by a restore request signal RQ due to some factor, the backup control circuit 300 instructs the power supply control circuit 400 in response to the power control signal PC, to restart the supply of power to the power block-off circuit 100. When power is supplied to the power block-off circuit 100, the backup control circuit 300 sets a save/restore instruction signal SN to be active, so that the internal state held in the backup memory circuit 500 is reset via the scan chains that are formed by the flip-flops 111 to 113 and 121 to 123 included in the save target circuit 210.

FIG. 2 schematically shows a state that the flip-flops 111 to 115 and 121 to 125 form the scan chains, respectively. A chain forming signal SC that is generated on the basis of a scan enable signal SE is supplied to the flip-flops 111 to 113 and 121 to 123, and the scan enable signal SE is supplied to the flip-flops 114 to 115 and 124 to 125. In the scan path test mode (a normal mode signal NM="0"), if the scan enable signal SE is made active ("1"), the flip-flops 111 to 115 and 121 to 125 form the scan chains, respectively, and a scan path test is performed. In addition, the chain forming signal SC is supplied to the flip-flops 111 to 113 and the flip-flops 121 to 123, and when the chain forming signal SC is active ("1"), namely, when the internal states are saved and restored, the flip-flops 111 to 113 and the flip-flops 121 to 123 form the scan chains. The chain forming signal SC is generated by the OR circuit 190 from the save/restore instruction signal SN outputted from the backup control circuit 300 and the scan enable signal SE inputted from the outside in the scan path test mode. In the scan path test mode, scan-in signals SI1 and SI2 are received from an external unit, and scan-out signals SO1 and SO2 are outputted to the outside. It should be noted that it is not necessary to form the scan chain in the saving and restoring operations since the internal states held in the flip-flops 114 to 115 and the flip-flops 124 to 125 are not targets of the saving and restoring operations.

The flip-flops 111 to 115 and the flip-flops 121 to 125 form the scan chains and are classified into the flip-flops 111 to 113 and the flip-flops 121 to 123 included in the save target circuit 210 and the flip-flops 114 to 115 and the flip-flops 124 to 125 included in a save non-target circuit 220. The flip-flops 111 to 113 and the flip-flops 121 to 123 are included in the save target circuit 210 and are the flip-flops used in the normal operation. The internal states that are held in these flip-flops are saved into the backup memory circuit 500 by using the scan chains, before the semiconductor integrated circuit 600 enters the standby state, namely, before the supply of power is blocked off. The flip-flops 114 to 115 and the flip-flops 124 to 125 are included in the save non-target circuit 220 and are the circuits used for a debugging operation or a test operation of the semiconductor integrated circuit 600, and these flip-flops are not involved in the normal operation.

The selecting circuits 161 to 162 are controlled in response to the normal mode signal NM indicating that the semiconductor integrated circuit 600 is in the normal operation. When the normal mode signal NM is inactive ("0"), namely, when the normal mode signal NM indicating the scan path test mode, the selecting circuits 161 to 162 select the scan-in signals SI1 and SI2 inputted from the external unit to transfer them to the scan chains. When the normal mode signal NM is active ("1"), namely, when the normal mode signal NM indicates the normal mode, the selecting circuits 161 to 162 select outputs MO1 and MO2 from the backup memory circuit 500 to transfer them to the flip-flops 111 and 121. In this case, if the chain forming signal SC is active, the scan chains are formed and the internal states held in the backup memory circuit 500 are provided to the flip-flops 111 and 121.

The selecting circuits 171 to 172 are controlled in response to the normal mode signal NM, to select one of the outputs of the save target circuit 210 and the save non-target circuit 220, and to output the selected one as the scan-out signals SO1 and SO2. In the saving and restoring operations for the save target circuit 210, the selecting circuits 171 to 172 operates to bypass the save non-target circuit 220. When the normal mode signal NM is inactive ("0"), namely, when the normal mode signal NM indicates the scan path test mode, the selecting circuits 171 to 172 select result data of the scan path test outputted from the flip-flops 115 and 125 and output the selected result data as the output signals SO1 and SO2. When the normal mode signal NM is active ("1"), namely, when the normal mode signal NM indicates normal mode, the selecting circuits 171 to 172 select the outputs of the flip-flops 113 and 123 located in the course of the scan chains, and output these outputs as the output signals SO1 and SO2. As a result, the scan chains bypass the save non-target circuit 220 in the normal mode, to shorten for the save non-target circuit 220. The data indicating only the internal state of the save target circuit 210 with the save non-target circuit 220 bypassed is stored in the backup memory circuit 500. It should be noted that two scan chains respectively having five flip-flops are shown here for ease of explanation; however, generally, the semiconductor integrated circuit includes many scan chains having many flip-flops. In addition, a plurality of scan chains operate in parallel.

Next, referring to FIG. 3, an operation of the semiconductor integrated circuit 600 will be described below.

In the scan path test mode, the normal mode signal NM which is inactive ("0"), is inputted from the outside (FIG. 3(b)). The selecting circuits 161 to 162 and 171 to 172 select signals on a "0" side and output the selected signals, since the normal mode signal NM is inactive. When inputting a test data, the scan enable signal SE is made active ("1") (FIG. 3(a)), and the chain forming signal SC in the active state ("1") is supplied from the OR circuit 190 to the flip-flops 111 to 115 and the flip-flops 121 to 125 (FIG. 3(f)). The flip-flops 111 to 115 and the flip-flops 121 to 125 form the scan chains, and the test data is inputted by the scan-in signals SI1 and SI2. When the test data is set via the scan chain, the scan enable signal SE is made inactive ("0") once and the scan chain is released. The calculation results by an internal logic circuit at this time are received by the flip-flops 111 to 115 and the flip-flops 121 to 125. After that, the scan enable signal SE is made active ("1") again, and the scan chains are formed. The data that are received by the flip-flops 111 to 115 and the flip-flops 121 to 125 are outputted to the outside as the scan-out signals SO1 and SO2. The test results that are included in the scan-out signals SO1 and SO2 are compared with the simulation results, and the normality of the semiconductor integrated circuit 600 is determined.

In the normal operation, the normal mode signal NM is set active ("1"), and the scan enable signal SE is set inactive ("0") (FIG. 3(a) and FIG. 3(b)). As a result, the flip-flops 111 to 115 and the flip-flops 121 to 125 operate without formation of the scan chains. When detecting that no processing to be carried out is left, the semiconductor integrated circuit 600 enter the standby mode. At that time, by carrying out a command of software, for example, hardware is instructed to enter the standby state. Here, the instruction is indicated by the standby instructing signal SB (FIG. 3(c)).

When the standby instructing signal SB is made active, the backup control circuit 300 makes the save/restore instruction signal SN active (FIG. 3(e)). The OR circuit 190 makes the chain forming signal SC active, which signal is an OR signal between the save/restore instruction signal SN and the scan enable signal SE, and the flip-flops 111 to 113 and the flip-flops 121 to 123 form scan chains (FIG. 3(f)). The internal states that are necessarily saved are held in the flip-flops 111 to 113 and the flip-flops 121 to 123, whereas the flip-flops 114 to 115 and the flip-flops 124 to 125 may not be built into the scan chains.

When the clock signal CLK is inputted while the chain forming signal SC is active, the flip-flops 111 to 113 and the flip-flops 121 to 123 shift the internal state data indicating the internal state in sequence within the formed scan chain. The selecting circuits 171 to 172 select the signals outputted from the flip-flops 113 and 123, since the normal mode signal NM is active. Then, the selecting circuits 171 to 172 output the selected signals to the backup memory circuit 500 as the scan-out signals SO1 and SO2. The backup memory circuit 500 stores the internal state data in the memory in sequence. Thereby, the saving operation of the internal state is carried out.

The internal state data are outputted from the flip-flops 113 and 123 of the final stages of the scan chains, that are formed within the save target circuit 210, to the backup memory circuit 500. As a result, the saving time is shortened, since circuit portions (the flip-flops 114 to 115 and the flip-flops 124 to 125) within the save non-target circuit 220 are bypassed. In addition, the capacitance of the backup memory circuit 500 can be reduced since the data that needs not to be saved is not stored in the backup memory circuit 500. Depending on the reduction of the capacitance of the backup memory circuit, the power consumption in the standby mode can be also reduced.

When the saving operation of the internal state is ended, the backup control circuit 300 instructs the power supply control circuit 400 in response to the power supply control signal PC to stop the supply of power to the power block-off circuit 100. The power supply control circuit 400 stops the supply of power PW to the power block-off circuit 100 (FIG. 3(g)). Hereinafter, the semiconductor integrated circuit 600 is set to the standby state. Since the supply of power to the power block-off circuit 100 is stopped, it is possible to reduce the power consumption amount of the semiconductor integrated circuit in the standby state.

If the restore request signal RQ is given to the semiconductor integrated circuit 600 (FIG. 3(d)) when passage of a predetermined time is notified by a timer in the standby state or when a signal from the outside is detected, the backup control circuit 300 starts a restoring operation. The backup control circuit 300 instructs the power supply control circuit 400 to restart the supply of power to the power block-off circuit 100 in response to the power supply control signal PC. The power supply control circuit 400 restarts supply of the power PW to the power block-off circuit 100 (FIG. 3(g)).

When the power is supplied to the power block-off circuit 100, the backup control circuit 300 makes the save/restore instruction signal SN active to instruct the flip-flops to form scan chains (FIG. 3(e)). The flip-flops 111 to 113 and the flip-flops 121 to 123 form the scan chains when the chain forming signal SC outputted from the OR circuit 190 is active (FIG. 3(f)). The signals MO1 and MO2 that indicate the saved internal states are outputted from the backup memory circuit 500 and supplied to the scan chains via the selecting circuits 161 to 162. The internal state data are shifted through the scan chains within the save target circuit 210 in an order of output from the backup memory circuit 500.

When the internal states that are saved into the flip-flops 111 to 113 and the flip-flops 121 to 123 included in the save target circuit 210 are reset, the backup control circuit 300 makes the save/restore instruction signal SN inactive (FIG. 3(e)). As a result, the chain forming signal SC outputted from the OR circuit 190 becomes inactive (FIG. 3(f)), so that the scan chains are released. As a result, the flip-flops 111 to 113 and the flip-flops 121 to 123 return to the operating state just before the standby state to restart the normal operation.

The internal state data supplied to the scan chain is data of the flip-flops included in the save target circuit 210 and this data does not contain internal state data of the save non-target circuit 220. As a result, the restoring operation can be shortened. Further, the selecting circuits 161 to 162 select the output signals MO1 and MO2 of the backup memory circuit 500 and output these output signals MO1 and MO2 to the flip-flops 111 and 121 since the normal mode signal NM is inactive excluding the scan path mode. Thus, according to the method for saving and restoring the internal state of the semiconductor integrated circuit of the present invention, it is possible to shorten the saving and restoring times and reduce the power consumption amount since the data indicating the internal state of the save non-target circuit 220 is not the target of the saving operation and the target of the restoring operation.

Figure 4A:
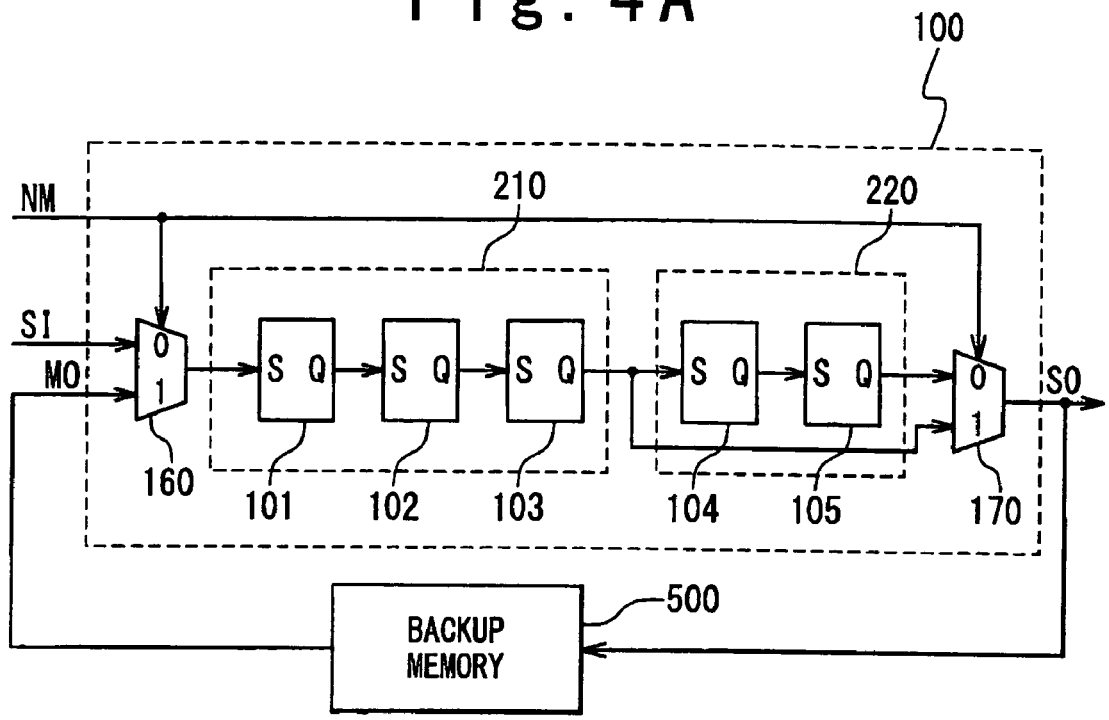
FIG. 4A is a diagram showing a connection example of as save target circuit and a save non-target circuit according to the embodiment of the present invention.

Referring to the scan chain shown in FIG. 2, the description that an output of the save target circuit 210 is supplied to the save non-target circuit 220 was made. However, the present invention is not limited to this. A scan chain may be represented by a single chain as shown in FIG. 4A, and the scan chain includes the flip-flops 101 to 105 and these flip-flops 101 to 105 are connected to one after another in this order. A selecting circuit 160 selects as the input signal of the scan chain, an output MO of the backup memory circuit 500 when the normal mode signal NM is active, and the selecting circuit 160 selects a scan-in signal SI of a scan path test when the normal mode signal NM is inactive. Then, the selecting circuit 160 supplies the selected signal to the flip-flop 101. In addition, a selecting circuit 170 bypasses the flip-flops 104 and 105 of the save non-target circuit 220 and selects the output of the flip-flop 103 when the normal mode signal NM is active, and the selecting circuit 170 selects the output of the flip-flop 105 of the final stage of the scan chain that is included in the save non-target circuit 220 when the normal mode signal NM is inactive and the selecting circuit 170 outputs the selected output.

Figure 4B:
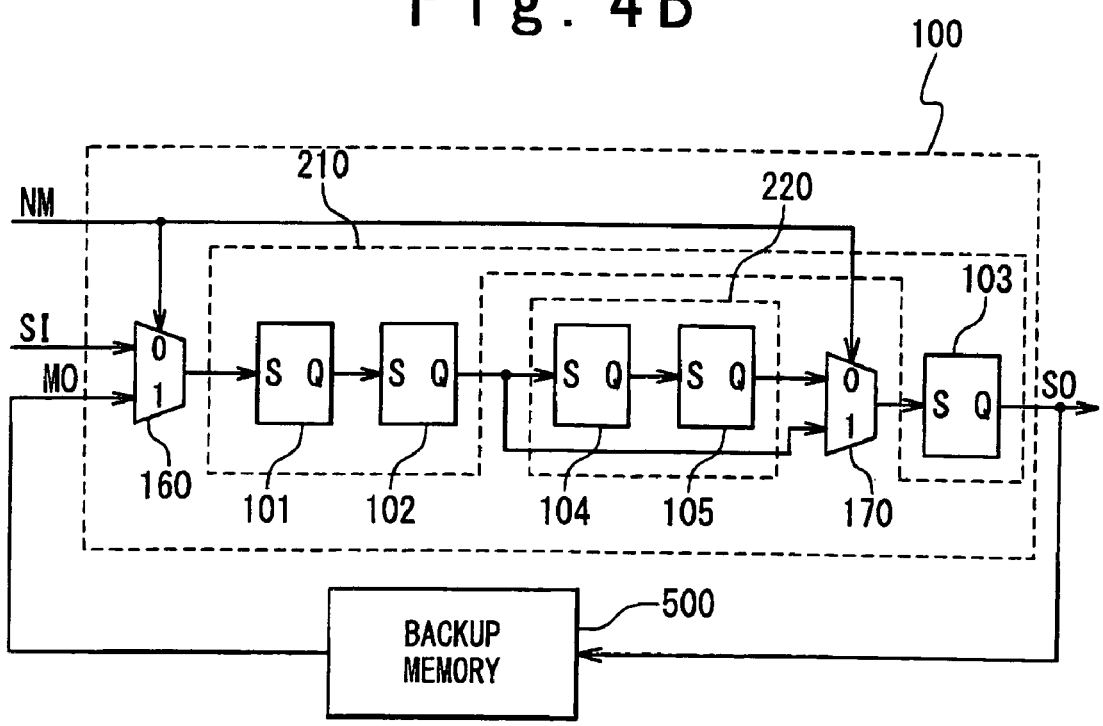
FIG. 4B is a diagram showing another connection example of the save target circuit and the save non-target circuit according to the embodiment of the present invention.

As shown in FIG. 4B, the save non-target circuit 220 and the selecting circuit 170 operate in the same way even if they are located between the flip-flops 102 and 103 of the save target circuit 210. Further, a plurality of save non-target circuits 220 and a plurality of selecting circuits 170 may be located. However, if many selecting circuits 170 are placed in a single scan chain, the circuit amount is increased, and this is not preferable. In this case, it is preferable to reduce the path of the scan chain as much as possible by shaping the path.

Figure 4C:
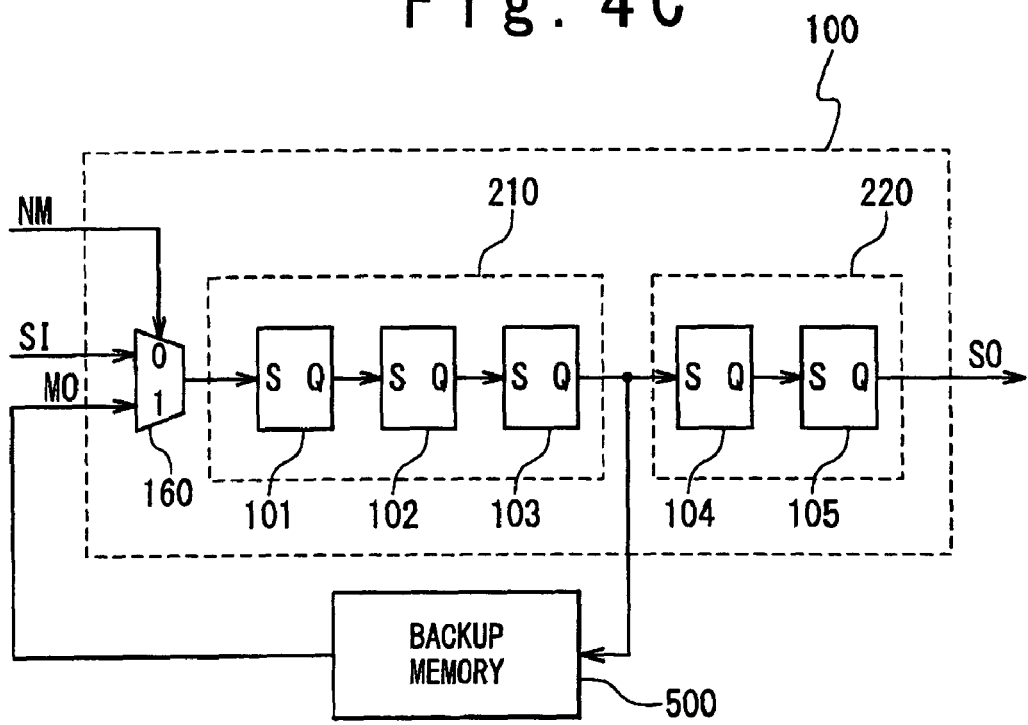
FIG. 4C is a diagram showing a still another connection example of the save target circuit and the save non-target circuit according to the embodiment of the present invention.

In addition, as shown in FIG. 4C, it is also possible to configure the power block-off circuit 100 in such a manner that the selecting circuit 170 just before a scan-out signal SO is removed and the output of the flip-flop 105 is outputted as the scan-out signal SO, and the output of the flip-flop 103 is outputted to the backup memory circuit 500. However, in consideration of confirmation of a normality of the semiconductor integrated circuit 600, it is preferable that the same path is used rather than providing other path.

Figure 5:
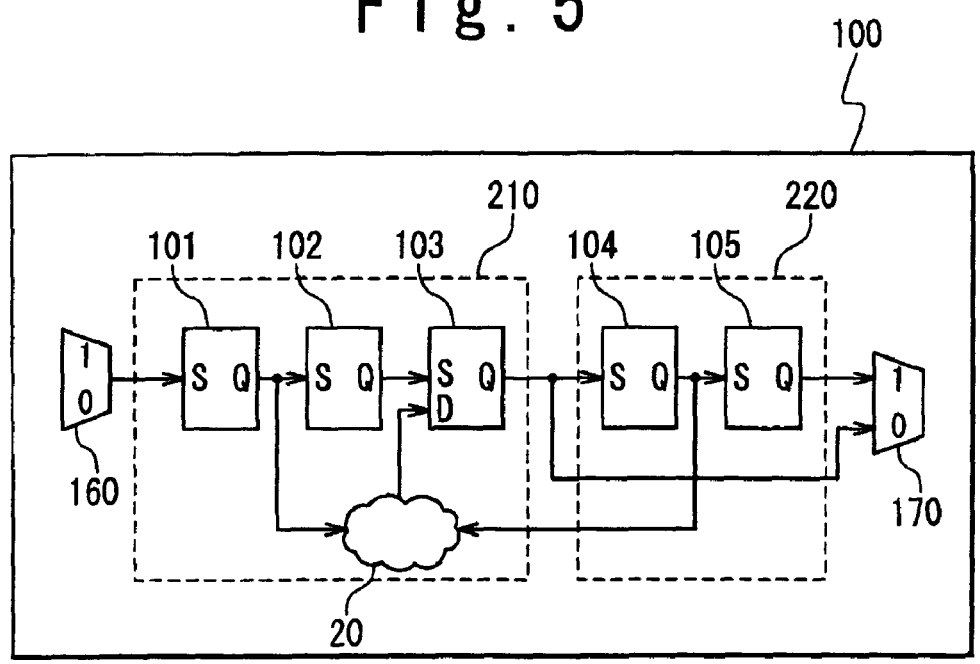
FIG. 5 is a diagram explaining an affect of the save non-target circuit according to the embodiment of the present invention.

According to the above description, the data path for saving and restoring operations has been explained. In the case that the outputs of the flip-flops 104 to 105 that are included in the save non-target circuit 220 do not affect the save target circuit 210, the above-described operations have no problem; however, in this case, the flip-flop 104 holds an unspecified value after the restoring operation since the power supply is blocked off in the standby state. Accordingly, as shown in FIG. 5, when the output of the flip-flop 104 included in the save non-target circuit 220 is subjected to some calculation by the combinational circuit 20 and is used as a data input of the flip-flop 103 included in the save target circuit 210 in the normal mode, there is a possibility that the value received by the flip-flop 103 is varied depending on the value held by the flip-flop 104.

Figure 6:
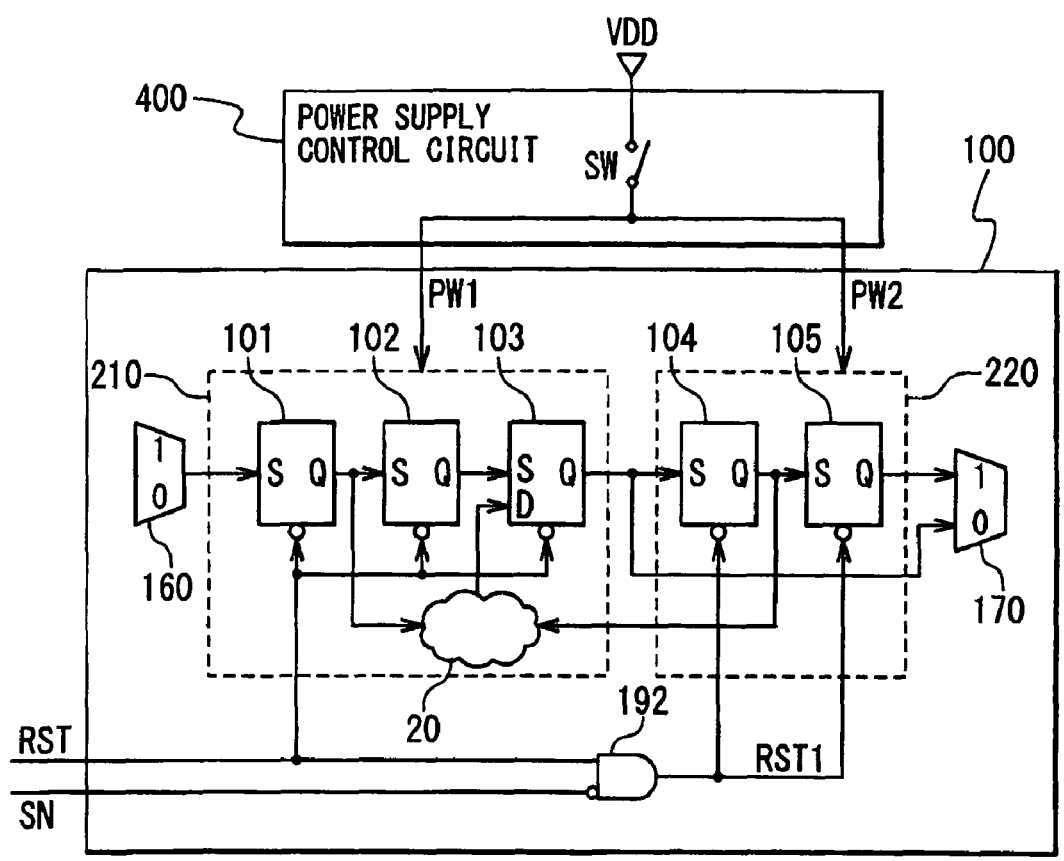
FIG. 6 is a diagram showing a first example in which influence of the save non-target circuit is prevented in the semiconductor integrated circuit according to the embodiment of the present invention.

As shown in FIG. 6, in the case that the supply of power to both of the save target circuit 210 and the save non-target circuit 220 is restarted in the restoring time, it is preferable that the values of the flip-flops 104 to 105 in the save non-target circuit 220 are fixed. The power supply control circuit 400 controls the power supply PW1 supplied to the save target circuit 210 and the power supply PW2 supplied to the save non-target circuit 220 by a switch SW, and the power supply control circuit 400 supplies power to both of the save target circuit 210 and the save non-target circuit 220 in the same way. In this case, a logic circuit 192 generates a reset signal RST1 on the basis of a normal reset signal RST and a save/restore instruction signal SN. The reset signal RST1 sets the flip-flops 104 to 105 to a predetermined state. In other words, when the reset signal RST is made active ("0"), or when the save/restore instruction signal SN is made active ("1"), the reset signal RST1 is made active ("0") to reset the flip-flops 104 to 105. Thereby, the flip-flops 104 to 105 hold predetermined values after the restoring operation, so that it is possible to prevent a false operation due to an inconstant value.

Figure 7:
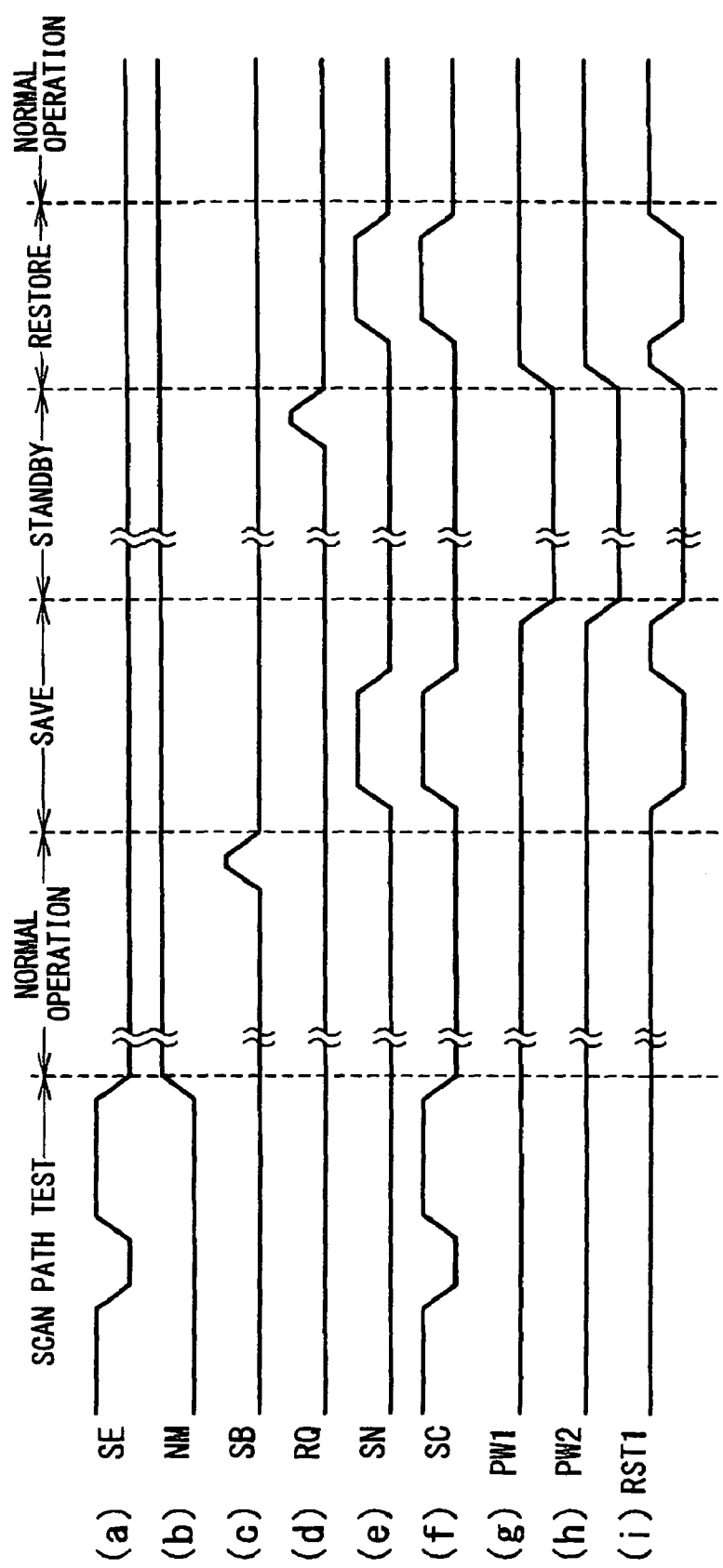
FIG. 7 shows timing charts in an operation of the semiconductor integrated circuit shown in FIG. 6.

Referring to FIG. 7, the operation will be briefly described below. FIGS. 7(a) to 7(f) are the same as FIG. 3. Therefore, the explanations thereof are herein omitted. The reset signal RST1 is made active ("0") when the reset signal RST is active and when the save/restore instruction signal SN is active. As a result, in the saving operation and in the restoring operation, the reset signal RST1 is active ("0") (FIG. 7(i)). In the saving state, both of the power supply PW1 supplied to the save target circuit 210 and the power supply PW2 supplied to the save non-target circuit 220 are stopped (FIGS. 7(g) and 7(h)).

Accordingly, at a point when the restoring operation is started, the flip-flops 101 to 105 hold unspecified values. At a point when the restoring operation is ended, the internal states are restored in the flip-flops 101 to 103, and the flip-flops 104 to 105 are reset to hold a predetermined value. As a result, it is possible to prevent the save target circuit 210 from being affected by the save non-target circuit 220.

Figure 8:
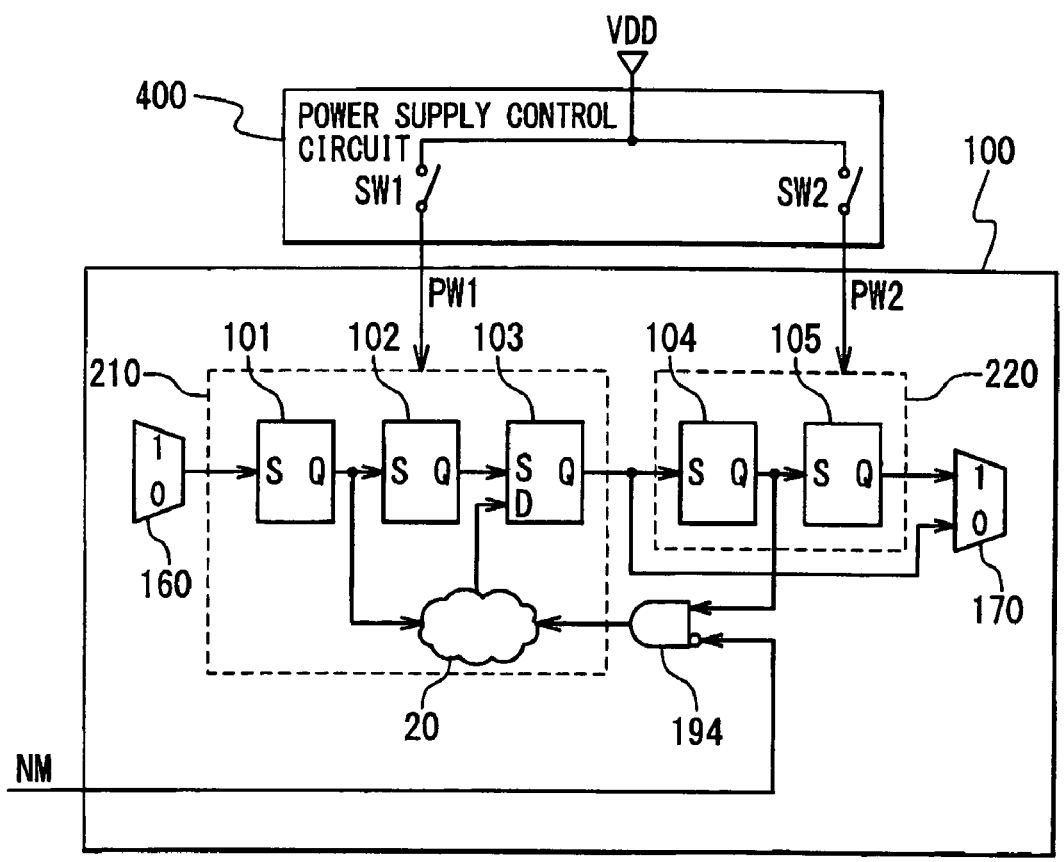
FIG. 8 is a diagram showing a second example in which influence of the save non-target circuit is prevented in the semiconductor integrated circuit according to the embodiment of the present invention.

In addition, as shown in FIG. 8, a masking circuit is inserted into a signal directed from the save non-target circuit 220 to the save target circuit 210, and the affect of the save non-target circuit 220 may be blocked off. In FIG. 8, the output of the flip-flop 104 directed to the combinational circuit 20 is masked by an AND circuit 194. The AND circuit (barrier gate) 194 outputs a fixed value "0" in the case that the normal mode signal NM is active ("1"), and then, the output of the flip-flop 104 is masked. By masking the output of the flip-flop, of which output is connected to the combinational circuit 20, among the flip-flops included in the save non-target circuit 220, it is possible to prevent the save target circuit 210 from being affected by the save non-target circuit 220.

Figure 9:
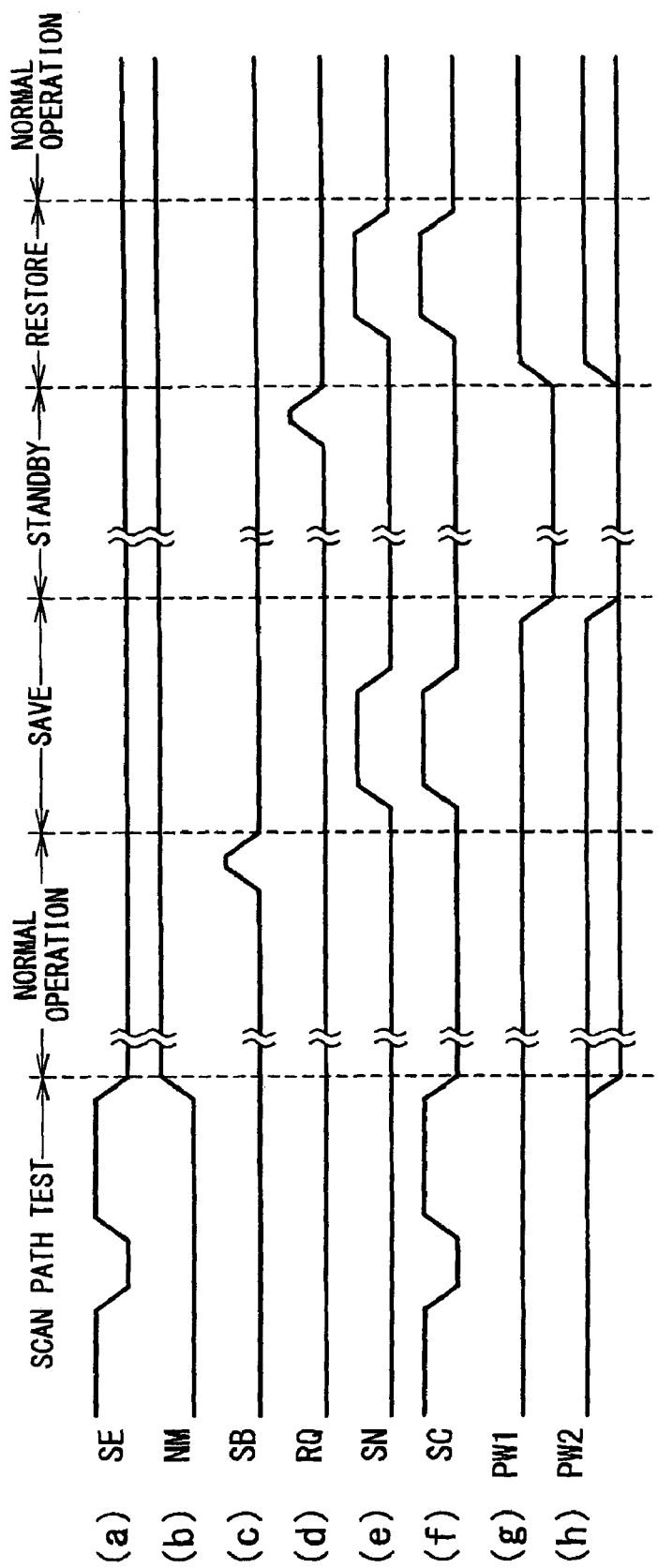
FIG. 9 shows timing charts in an operation of the semiconductor integrated circuit shown in FIG. 8.

In other words, as shown in FIG. 9, when the normal mode signal NM is made active ("1"), the output signal of the save non-target circuit 220 is masked. As a result, the save target circuit 210 is not affected by the save non-target circuit 220. As shown in FIG. 9(g), the power supply PW1 supplied to the save target circuit 210 is stopped in the standby state, and before start of the restoring operation, the power supply PW1 is restarted. On the other hand, if the normal mode signal NM is active, the save target circuit 210 is not affected, so that the power supply PW2 supplied to the save non-target circuit 220 can be stopped while the normal mode signal NM is active (FIG. 9(h)).

It should be noted that the method for blocking the affect by means of this masking circuit is not limited to a circuit that is provided with a switch SW1 for controlling the supply of power to the save target circuit 210 and a switch SW2 for controlling the supply of power to the save non-target circuit 220, as shown in FIG. 8. As shown in FIG. 6, this method for blocking the affect by means of this masking circuit may be also applied to the case of controlling the supply of power to the save target circuit 210 and the save non-target circuit 220 by means of only one kind of switch SW.

Figure 10A:
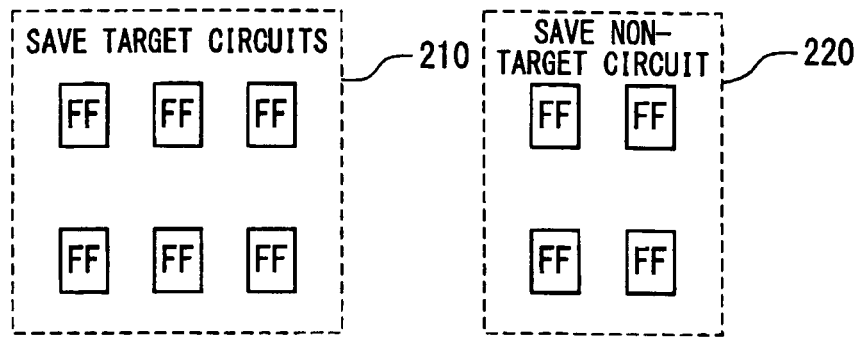
FIGS. 10A to 10C show a design procedure of the scan chain.

Next, the idea of a scan chain design will be described. At first, as shown in FIG. 10A, the save target circuit 210 that is a main part of the semiconductor integrated circuit 600 and the save non-target circuit 220 that is a test circuit or a debugging circuit in the semiconductor integrated circuit 600 are designed to satisfy their original functions. Normally, the circuits are arranged near to each other for each function, so that the circuit for the test and the circuit for the normal operation are designed to be separated from each other. The save target circuit 210 and the save non-target circuit 220 are respectively designed as a circuit of a different design layer. In order to control the supply of power, the circuits included in the power block-off circuit 100 are clearly separated from other circuits.

Figure 10B:
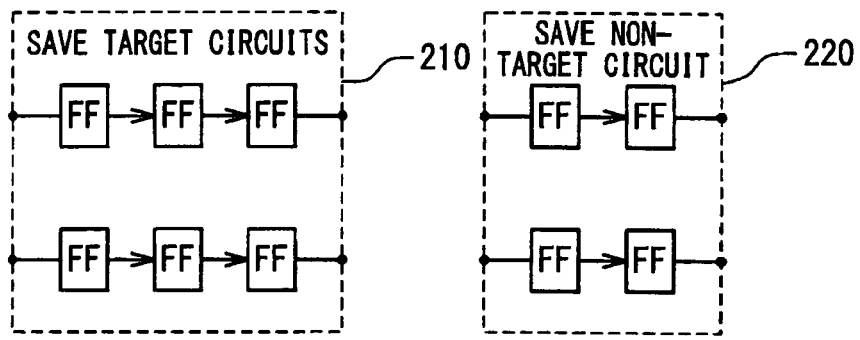

If the original functional portions of respective circuits are designed, the scan data input and output of the built-in flip-flops are connected in sequence according to a predetermined method, as shown in FIG. 10B, and the scan chain is designed for each design layer. In this case, the length of the scan chain, namely, the number of flip-flops included in the scan chain is adjusted. At least, the lengths of the scan chain are aligned, and inner states are saved into the same memory circuit at the same time.

Figure 10C:
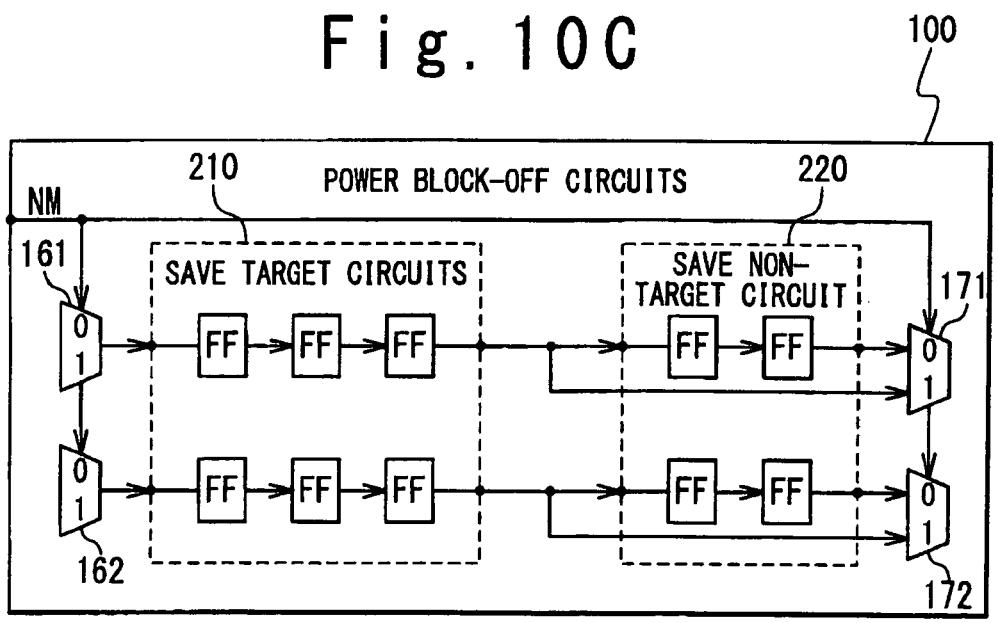

If the scan chain in each circuit is designed, the scan chain of the save target circuit 210 and the scan chain of the save non-target circuit 220 are connected to each other, as shown in FIG. 10C. In response to the saving and restoring operations, the selecting circuits 161 to 162 and the selecting circuits 171 to 172 are provided, and a circuit for saving and restoring internal data using the scan chain is completed with the control signal lines connected to each other.

An example of a scan chain design has been illustrated; however, the present invention is not limited to this method. Any method is available if the scan chain is placed with the save target circuit 210 and the save non-target circuit 220 discriminated each other.

The normal mode signal NM is inputted from the outside here; however, the normal mode signal NM may be generated by other control circuit such as a TAP controller. In addition, the backup control circuit may be configured being combined with the TAP controller.

In this way, according to the present invention, when saving and restoring the internal state, the scan chain is placed while bypassing the circuits that are not required to hold the data. As a result, it is possible to provide a semiconductor integrated circuit and a method for saving and restoring the internal state of the semiconductor integrated circuit, which are capable of shortening the saving and restoring times of the internal state and reducing the power consumption.

What is claimed is:

1. A semiconductor integrated circuit, comprising:
   a scan chain which comprises:
      first flip-flops contained in a first circuit and second flip-flops contained in a second circuit, wherein said first flip-flops and said second flip-flops are connected in a series connection in a scan path test mode to operate as a shift register;
      a first selecting circuit configured to selectively output a test data in the scan path test mode and internal state data indicating an internal state of said first flip-flops and read from a memory circuit in a restoring operation in a normal mode to said series connection; and
      a second selecting circuit provided between one of said second flip-flops and one of said second flip-flops subsequent to said one second flip-flop in said series connection and configured to select an output of said one second flip-flop in the scan path test mode and an output of one of said first flip-flops which is previous to said one second flip-flop or a series connection of said second flip-flops including said one second flip-flop; and
   a backup control circuit configured to control said scan chain in a saving operation in the normal mode such that the internal state data is stored in the memory circuit without passing through said second flip-flops, in the restoring operation in the normal mode such that the internal state data from said first selecting circuit is set in said first flip-flops without passing through said second flip-flops, and in the scan path test mode such that the test data is shifted in the series connection.

2. The semiconductor integrated circuit according to claim 1, wherein said first flip-flops are connected in series and further said second flip-flops are connected in series, and
   said scan chain further comprises a second selecting circuit provided at a last stage of said series connection and configured to select an output from said second circuit in the scan path test mode and the internal state data in the saving operation in the normal mode.

3. The semiconductor integrated circuit according to claim 1, further comprising:
   a power supply control circuit configured to control supply of power to said first circuit and said second circuit, and
   wherein said backup control circuit instructs said power supply control circuit to stop the supply of the power to said first circuit and said second circuit, after the saving operation is completed, and instructs said power supply control circuit to restart the supply of the power to said first circuit before starting the restoring operation.

4. The semiconductor integrated circuit according to claim 3, wherein said backup control circuit controls said power supply control circuit to restart the supply of the power to said second circuit before starting the restoring operation.

5. The semiconductor integrated circuit according to claim 4, further comprising:
   a reset circuit configured to initialize said second flip-flops when the restoring operation ends.

6. The semiconductor integrated circuit according to claim 1, further comprising:
   a barrier gate circuit provided between said first circuit and said second circuit and configured to block off an output signal from said second circuit to said first circuit.

7. The semiconductor integrated circuit according to claim 1, wherein said memory circuit is provided in said semiconductor integrated circuit.

8. The semiconductor integrated circuit according to claim 7, wherein said memory circuit comprises a non-volatile memory circuit.

9. A method of saving and restoring an internal state in a semiconductor integrated circuit, comprising:
   providing a scan chain which comprises:
      first flip-flops contained in a first circuit and second flip-flops contained in a second circuit, wherein said first flip-flops and said second flip-flops are connected in a series connection to be operable as a shift register; and
      a first selecting circuit connected to a front stage of said series connection;
   selecting in said first selecting circuit, a test data in the scan path test mode and internal state data indicating an internal state of said first flip-flops and outputted from a memory circuit in a restoring operation in a normal mode;
   passing the test data through said scan chain in the scan path test mode;
   saving the internal state data in said memory circuit without passing through said second flip-flops, in a saving operation in the normal mode; and
   restoring the internal state data in said first flip-flops without passing through said second flip-flops in the restoring operation in the normal mode,
   wherein said providing further comprises providing a second selecting circuit between one of said second flip-flops and one of said first flip-flops subsequent to said one second flip-flop, and
   wherein said saving comprises selecting an output of said one second flip-flop in the scan path test mode and an output of a last one of said first flip-flops which is at least previous to said one second flip-flop in the saving operation in the normal mode.

10. The method according to claim 9, wherein said providing comprises:
    connecting said first flip-flops in series and further connecting said second flip-flops in series; and
    connecting a second selecting circuit to a last stage of said series connection,
    wherein said saving comprises selecting in said second selecting circuit, an output from said second circuit in the scan path test mode and the internal state data in the saving operation in the normal mode such that the internal state data is saved in said memory circuit.

11. The method according to claim 9, further comprising:
stopping supply of power to said first circuit and said second circuit, after said saving; and
restarting the supply of power to said first circuit before said restoring.

12. The method according to claim 11, further comprising:
restarting the supply of power to said second circuit before said restoring.

13. The method according to claim 12, further comprising:
resetting said second flip-flops when said restoring ends.

14. The method according to claim 9, further comprising:
blocking off an output signal from said second circuit at a boundary between said first circuit and said second circuit.

\* \* \* \* \*